(12) United States Patent
Goh et al.

(10) Patent No.: US 7,968,148 B2
(45) Date of Patent: Jun. 28, 2011

(54) INTEGRATED CIRCUIT SYSTEM WITH CLEAN SURFACES

(75) Inventors: Yin-Min Felicia Goh, Singapore (SG); Zainab Ismail, Singapore (SG); Yong Siang Tan, Singapore (SG); Ling Zhi Tan, Singapore (SG); Sin Ping Chiew, Kuala Lumpur (MY)

(73) Assignee: Globalfoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 11/854,972

(22) Filed: Sep. 13, 2007

(65) Prior Publication Data

US 2008/0069958 A1    Mar. 20, 2008

Related U.S. Application Data

(60) Provisional application No. 60/825,751, filed on Sep. 15, 2006.

(51) Int. Cl.
*B05D 3/10* (2006.01)
*B08B 3/08* (2006.01)

(52) U.S. Cl. .......... 427/307; 427/299; 427/314; 134/26; 134/28

(58) Field of Classification Search .............. 427/96, 427/307, 299, 314; 134/26, 28, 10, 95.1
See application file for complete search history.

(56) References Cited

U.S. PATENT DOCUMENTS

| | | | | | |
|---|---|---|---|---|---|
| 4,264,374 | A | * | 4/1981 | Beyer et al. | 134/3 |
| 5,803,980 | A | * | 9/1998 | Pas et al. | 134/2 |
| 6,132,522 | A | * | 10/2000 | Verhaverbeke et al. | 134/26 |
| 6,713,353 | B1 | | 3/2004 | Kanda et al. | |
| 6,821,854 | B2 | | 11/2004 | Kanda et al. | |
| 7,084,048 | B2 | | 8/2006 | Shive et al. | |
| 2004/0209441 | A1 | * | 10/2004 | Maleville et al. | 438/455 |
| 2005/0116360 | A1 | * | 6/2005 | Huang et al. | 257/900 |
| 2005/0236626 | A1 | | 10/2005 | Takafuji et al. | |
| 2006/0246217 | A1 | | 11/2006 | Weidman et al. | |
| 2006/0264043 | A1 | * | 11/2006 | Stewart et al. | 438/678 |

OTHER PUBLICATIONS

S. Wolf ( Silicon Processing for the VLSI Era, vol. 4-Deep Submicron Process Technology, Lattice Press, 2002. pp. 573-578).*

* cited by examiner

*Primary Examiner* — Nadine Norton
*Assistant Examiner* — Mahmoud Dahimene
(74) *Attorney, Agent, or Firm* — Mikio Ishimaru

(57) ABSTRACT

An integrated circuit system includes providing an integrated circuit wafer; applying a first cleaning solution over the integrated circuit wafer; and applying a second cleaning solution over the integrated circuit wafer to prevent or remove a defect resulting from the first cleaning process.

20 Claims, 5 Drawing Sheets

INTEGRATED CIRCUIT SYSTEM WITH CLEAN SURFACES

CROSS-REFERENCE TO RELATED APPLICATION(S)

This application claims the benefit of U.S. Provisional application No. 60/825,751 filed Sep. 15, 2006.

TECHNICAL FIELD

The present invention relates generally to integrated circuit systems, and more particularly to a system for integrated circuit with surfaces.

BACKGROUND ART

Integrated circuits have become an integral part of our daily live particularly in many portable electronic products such as cell phones, portable computers, voice recorders, etc. Integrated circuits are also in many larger electronic systems, such as cars, planes, industrial control systems, etc. Across virtually all applications, there continues to be demand for improving costs of electronic devices.

Consumer demand for smaller, cheaper, faster electronic products directly affects all aspects of integrated circuit manufacturing. Increasing demand across virtually all aspects of modern life is driving improvements in integrated circuit technology. Generally, integrated circuits can also be referred to as 'semiconductor device', 'chip' or 'die'.

The integrated circuit is manufactured through several technologies and processes. Most of the critical processes require some form of preparation or cleaning. Improvements and developments in preparation or cleaning directly contribute to lower costs including existing materials, known processes, and high yield for a large percentage of usable devices.

Prior to mixing metals such as Co or Ni with other semiconductors for improved performance, a cleaning process using an acid as the last step is used to ensure oxide-free surfaces for processing the metals. Conventional processes using acid as the last step during wet cleaning utilizing either dilute or buffered hydrofluoric acid solutions that result in surfaces, which are susceptible to the contamination of organic or carbon-based deposits during or after the clean.

These contaminants could be in the form of residues, particles, etc and would block subsequent metal deposits resulting in adverse performance and manufacturing impacts on the integrated circuit device. The impacts can range from poor performance to failure of the integrated circuit devices. If the performance is poor enough or in the event of failure, the integrated circuit devices are unusable. The unusable integrated circuit devices reduce the ratio or percentage of the usable integrated circuit devices sometimes referred to as yield.

Low yield or a small percentage of usable integrated circuit devices results in a higher cost for each usable integrated circuit device. There are typically fixed costs for the materials including the integrated circuit wafer on which the integrated circuit die are manufactured. Even more costly can be integrated circuit devices that seem to be usable initially but suffer from poor performance or failure after being utilized in a product. The accumulated costs of manufacturing the integrated circuit devices through all the steps of a product's process is often much more significant than the cost of unusable integrated circuit devices.

Across virtually all applications, there continues to be growing demand for lower cost and increasing performance of integrated circuits. The seemingly endless restrictions and requirements are no more visible than with products in our daily lives. Less costly integrated circuits are expected in many portable electronic products as well as in many larger electronic systems.

As the demand continues to grow for lower cost electronic products, manufacturers are seeking ways to provide higher capacity manufacturing with well-known and cost effective materials and methods.

Thus, a need still remains for an integrated circuit system to provide improved cost and manufacturing yield. In view of the increasing demand for improved integrated circuits and particularly higher yields and lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit wafer; applying a first cleaning solution over the integrated circuit wafer; and applying a second cleaning solution over the integrated circuit wafer to prevent or remove a defect resulting from the first cleaning process.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
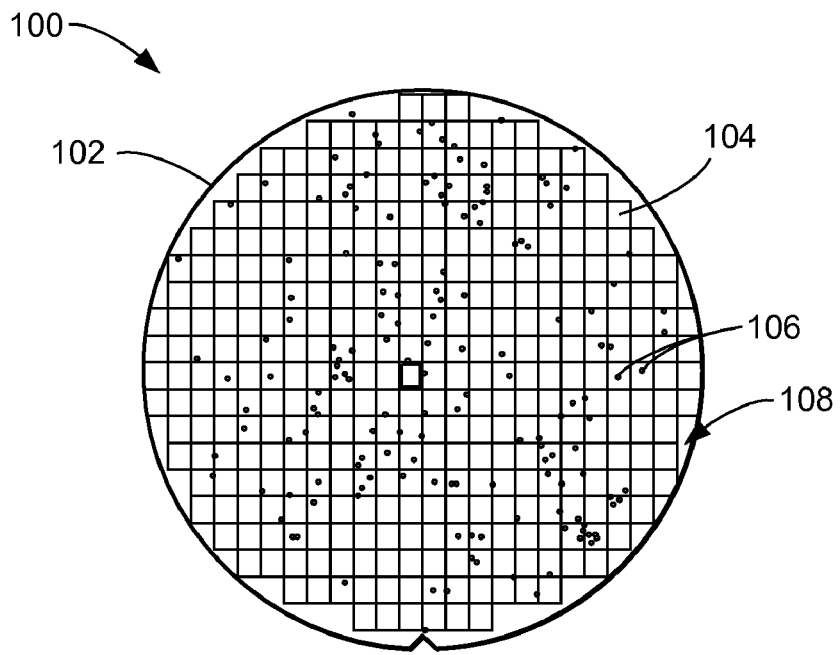
FIG. 1 is a top view of an integrated circuit system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on" "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a top view of an integrated circuit system 100 in a first embodiment of the present invention. The integrated circuit system 100 preferably includes an integrated circuit wafer 102 having integrated circuit die 104. Defects 106 can also be formed over the integrated circuit wafer 102 or active layers (not shown) over the integrated circuit wafer 102. The defects 106 can be substantially eliminated over a significant portion of the integrated circuit wafer 102 or the integrated circuit die 104.

A first cleaning process such as a dilute acid process including a dilute hydrofluoric (DHF) process and a second cleaning process such as a Standard Clean-2 (SC2) process can be applied over a wafer active surface 108 such as silicon, active, or polysilicon surfaces of the integrated circuit wafer 102. The defects 106 can be formed by a preparation process such as a pre-silicidation process using a first cleaning solution such as a dilute acid solution or a DHF solution over the integrated circuit wafer 102. An acid such as hydrofluoric acid can provide hydrogen-terminated surfaces susceptible to deposition during or after processing of organic or carbon-based contaminants such as the defects 106 that can be prevented or removed by the cleaning process.

For example, a DHF solution including a dilute hydrofluoric acid (HF) can be applied to clean an oxide (not shown) as an HF-based wet etch over the wafer active surface 108 and provide a hydrophobic surface for a subsequent wafer process such as a silicidation process for annealing a silicide or salicide layer of cobalt (Co) or nickel (Ni). The DHF solution can leave the defects 106 such as organic defects, carbon-based defects, or arsenic dopant defects over the wafer active surface 108 of the integrated circuit wafer 102.

Further to the example, a second cleaning solution, such as an SC2 solution including hydrochloric acid (HCl), hydrogen peroxide ($H_2O_2$), water ($H_2O$), or combinations thereof, can be applied to prevent or remove the defects 106 and substantially preserve the hydrophobic surface. The SC2 solution can form a thin, self-limiting chemical oxide (not shown) rendering a partially hydrophilic surface minimizing deposition of the defects 106. The SC2 solution can include HCl, $H_2O_2$, or $H_2O$ in a ratio range of 1:1:1 to 1:1:1000 and be applied in a temperature range from twenty degrees Celsius (20° C.) to eighty degrees Celsius (80° C.).

Contact angle measurements can quantify the hydrophobic level of the wafer active surface 108. Table 1 shows examples of contact angles for various cleaning solutions. A larger value for the contact angle indicates an increased hydrophobic surface while the converse, a smaller value for the contact angle, indicates an increased hydrophilic surface. The example contact angle for the SC2 solution is in a range that indicates a substantially hydrophobic surface. The contact angles for the DHF+SC1 process and the DHF+SPM process are not shown in part due to the difficulty in measuring small contact angles particularly when approaching a value of zero.

TABLE 1

Contact angle and chemical oxide thickness of various cleaning solutions on Si Surface

| Cleaning chemistry | Contact angle (deg) | Chemical oxide thickness (Å) |
|---|---|---|
| BHF | 74.4 | not done |
| DHF | 80.6 | 1.45 |
| DHF + SC2 | 65.9 | 2.72 |
| DHF + SC1 | cannot be measured | 7.96 |
| DHF + SPM | Cannot be measured | 9.59 |

An example of a surface cleaning process can preferably include applying the DHF solution including dilute HF, a de-ionized water (DIW) rinse, and the SC2 solution including HCl, $H_2O_2$, and $H_2O$. The process sequence can be shown as DHF->DIW rinse->SC2->DIW rinse->Dry. The integrated circuit wafer 102 can include a significantly improved number of the defects 106. The integrated circuit wafer 102 can also include approximately three hundred fifty-eight of the integrated circuit die 104.

The defects 106 can affect significantly less than half of the integrated circuit die 104. Some number of the integrated circuit die 104 can include more than one of the defects 106 and some number of the integrated circuit die 104 can typically be discarded due to processing issues near outer extents of the integrated circuit wafer 102. Further, some number of the defects 106 can be located or formed without affecting any of the integrated circuit die 104.

For illustrative purposes, three hundred fifty-eight of the integrated circuit die 104 are shown although it is understood that any number of the integrated circuit die 104 may be formed. Further, for illustrative purposes approximately twenty-four or approximately one fifteenth of the integrated circuit die 104 are shown as discards although it is understood that any number of the integrated circuit die 104 may be discards.

It has been unexpectedly discovered that applying the first cleaning process such as the dilute acid process or the DHF process and the second cleaning process such as the SC2 process of the integrated circuit system 100 provides significantly reduced numbers of the defects 106 affecting significantly less of the integrated circuit die 104 while rendering the wafer active surface 108 substantially hydrophobic. The first cleaning process and the second cleaning process substantially prevent or remove the defects 106 from the wafer active surface 108 such as silicon, active, or polysilicon surfaces.

Figure 2:
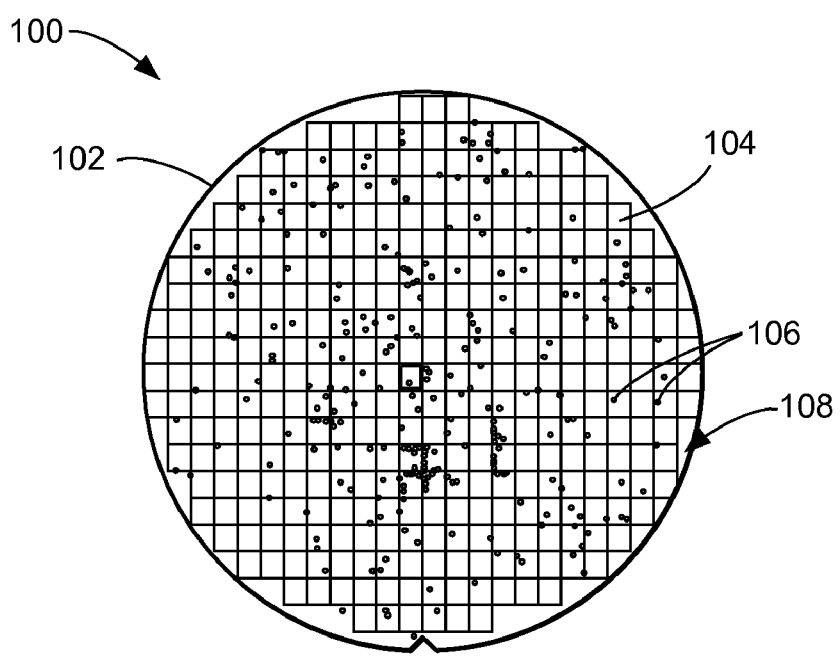
FIG. 2 is the integrated circuit system in a DHF process phase.

Referring now to FIG. 2, therein is shown the integrated circuit system 100 in a DHF process phase. The integrated circuit system 100 includes the integrated circuit wafer 102, the integrated circuit die 104, and the defects 106 over the wafer active surface 108.

For example, the integrated circuit wafer can include twin-wells (not shown) with shallow trench isolation (STI) (not shown). Active area implants (not shown) can include arsenic (As) dosages of approximately one times ten to the fifteenth power atoms per square centimeter (E15 atom/cm$^2$) and energies less than fifty thousand electron volts (50 keV). The integrated circuit wafer 102 can also include approximately seven hundred ninety of the defects 106. The integrated circuit wafer 102 also includes approximately three hundred fifty-eight of the integrated circuit die 104.

The defects 106 can affect many of the integrated circuit die 104. Some number of the integrated circuit die 104 can include several of the defects 106, though there can be an average of more than two of the defects 106 per each of the integrated circuit die 104. An actual yield of the integrated circuit die 104 can also be decreased due to processing issues near the outer extents of the integrated circuit wafer 102.

Figure 3:
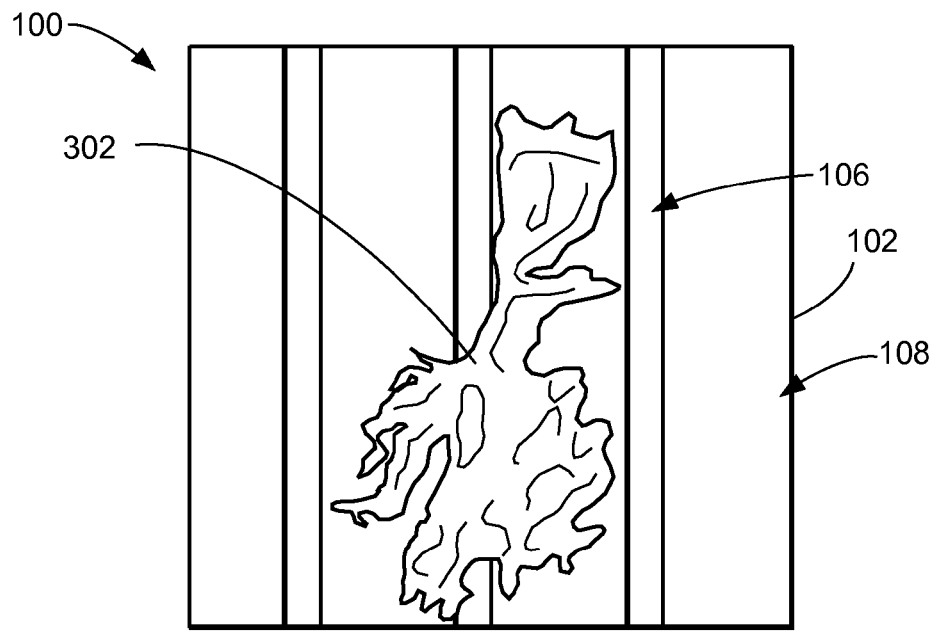
FIG. 3 is the structure of FIG. 2 in a detailed view.

Referring now to FIG. 3, therein is shown the structure of FIG. 2 in a detailed view. The integrated circuit system 100 includes the integrated circuit wafer 102 and the defects 106 over the wafer active surface 108. For example, the defects 106 are shown as a residue 302 such as an organic or carbon-based residue deposited due to the DHF process.

The residue 302 can prevent completion or integrity of subsequent processes such as silicidation over the wafer active surface 108. For illustrative purposes, the residue 302 is shown having a shape of a string although it is understood that the residue 302 may be of any shape or dimension.

Figure 4:
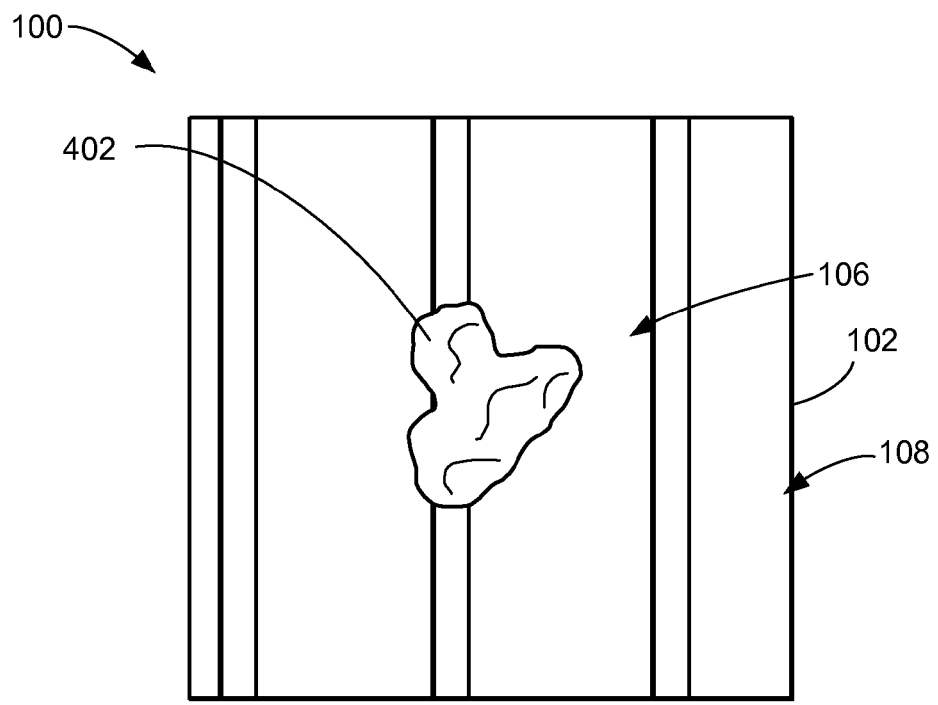
FIG. 4 is the structure of FIG. 2 in a detailed view.

Referring now to FIG. 4, therein is shown the structure of FIG. 2 in a detailed view. The integrated circuit system 100 includes the integrated circuit wafer 102 and the defects 106 over the wafer active surface 108. For example, the defects 106 are shown as a particle 402 such as an organic or carbon-based particle deposited due to the DHF process.

The particle 402, the residue 302 of FIG. 3, or combinations thereof can prevent completion or integrity of subsequent processes such as silicidation over the wafer active surface 108. For illustrative purposes, the particle 402 is shown having a shape of a ball although it is understood that the particle 402 may be of any shape or dimension.

Figure 5:
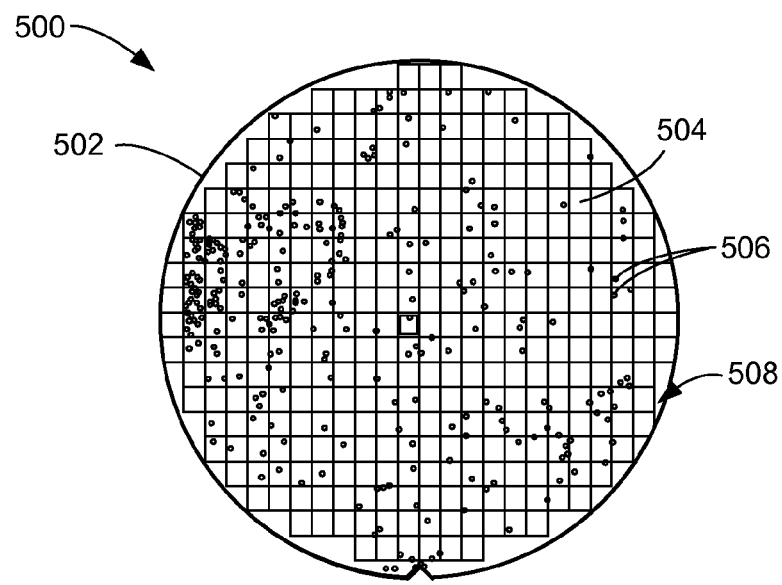
FIG. 5 is a top view of an integrated circuit system in a second embodiment of the present invention.

Referring now to FIG. 5, therein is shown a top view of an integrated circuit system 500 in a second embodiment of the present invention. The integrated circuit system 500 preferably includes an integrated circuit wafer 502 having integrated circuit die 504. Defects 506 can also be formed over the integrated circuit wafer 502 or active layers (not shown) over the integrated circuit wafer 502. The defects 506 can be substantially eliminated over a significant portion of the integrated circuit wafer 502 or the integrated circuit die 504.

A first cleaning process such as a buffered acid process including a buffered hydrofluoric (BHF) process and a second cleaning process such as a Standard Clean-2 (SC2) process can be applied over a wafer active surface 508 of the integrated circuit wafer 502. The defects 506 can be formed by a preparation process such as a pre-silicidation process using a first cleaning solution such as a buffered acid solution or a BHF solution over the integrated circuit wafer 502. An acid such as hydrofluoric acid can provide hydrogen-terminated surfaces susceptible to deposition during or after processing of organic or carbon-based contaminants such as the defects 506 that can be prevented or removed by the cleaning process.

For example, a BHF solution including a buffered hydrofluoric acid (HF) can be applied to clean an oxide (not shown) as an HF-based wet etch over the wafer active surface 508 and provide a hydrophobic surface for a subsequent wafer process such as a silicidation process for annealing a silicide or salicide layer of cobalt (Co) or nickel (Ni). The BHF solution can leave the defects 506 such as organic defects, carbon-based defects, or arsenic dopant defects over the integrated circuit wafer 502.

Further to the example, a second cleaning solution, such as an SC2 solution including hydrochloric acid (HCl), hydrogen peroxide ($H_2O_2$), water ($H_2O$) or combinations thereof, can be applied to prevent or remove the defects 506 and substantially preserve the hydrophobic surface. The SC2 solution can form a thin, self-limiting chemical oxide (not shown) rendering a partially hydrophilic surface minimizing deposition of the defects 506. The SC2 solution can include HCl, $H_2O_2$, or $H_2O$ in a ratio range of 1:1:1 to 1:1:1000 and be applied in a temperature range from twenty degrees Celsius (20° C.) to eighty degrees Celsius (80° C.).

An example of a surface cleaning process can preferably include applying the BHF solution including buffered HF, a de-ionized water (DIW) rinse, and the SC2 solution including HCl, $H_2O_2$, and $H_2O$. The process sequence can be shown as BHF->DIW rinse->SC2->DIW rinse->Dry. The integrated circuit wafer 502 can include a significantly improved number of the defects 506. The integrated circuit wafer 502 can also include approximately three hundred fifty-eight of the integrated circuit die 504.

The defects 506 can affect significantly less than the total number of the integrated circuit die 504. Some number of the integrated circuit die 504 can include more than one of the defects 506 and some number of the integrated circuit die 504 can typically be discarded due to processing issues near outer extents of the integrated circuit wafer 502. Further, some number of the defects 506 can be located or formed without affecting any of the integrated circuit die 504.

For illustrative purposes, three hundred fifty-eight of the integrated circuit die 504 are shown although it is understood that any number of the integrated circuit die 504 may be formed. Further, for illustrative purposes approximately twenty-four or approximately one fifteenth of the integrated circuit die 504 are shown as discards although it is understood that any number of the integrated circuit die 504 may be discards.

Figure 6:
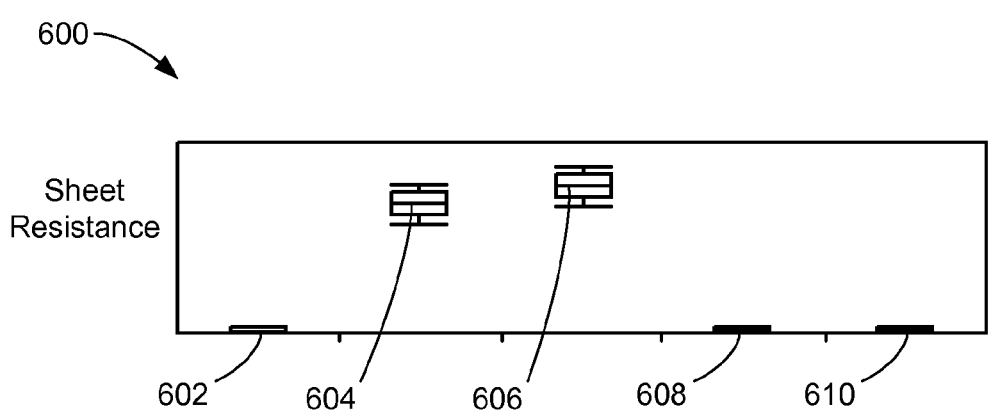
FIG. 6 is a chart of active region sheet resistance of the integrated circuit system of FIG. 1.

Referring now to FIG. 6, therein is shown a chart of active region sheet resistance 600 of the integrated circuit system 100 of FIG. 1. The chart 600 shows sheet resistance (Rs) for active regions using various cleaning processes.

A first Rs 602 results from a sulfuric peroxide mixture (SPM) process including sulfuric acid ($H_2SO_4$), hydrogen peroxide ($H_2O_2$), water ($H_2O$) or combinations thereof, and the DHF process applied over the integrated circuit wafer 102 of FIG. 1. The SPM+DHF process provides improved electrical properties with degraded yield.

A second Rs 604 results from the DHF process, the SPM process, and a Standard Clean-1 (SC1) process including ammonium hydroxide ($NH_4OH$), hydrogen peroxide ($H_2O_2$), water ($H_2O$) or combinations thereof, applied over the integrated circuit wafer 102. The DHF+SPM+SC1 process provides degraded electrical properties.

A third Rs 606 results from the SPM process, the DHF process, the SC1 process, and the SC2 process applied over the integrated circuit wafer 102. The SPM+DHF+SC1+SC2 process provides degraded electrical properties.

A fourth Rs 608 results from the SPM process, the DHF process with a single wafer spin processor (not shown) over the integrated circuit wafer 102. The SPM+DHF process with single wafer spin processor provides improved electrical properties at a high cost in both throughput and equipment.

A fifth Rs 610 results from the DHF process and the SC2 process applied over the integrated circuit wafer 102. The DHF+SC2 process provides improved electrical properties with known technology and materials.

For example, a wet bench and batch process can be used for each of the cleaning processes above except for the single wafer spin process that would require a spin tool. Table 2 shows that for the SPM+DHF process above, the defects 106 of FIG. 1 would not be removed. Table 2 also shows that for each of the other processes above the defects 106 would be prevented or removed.

TABLE 2

Summary of various cleaning techniques employed to remove arsenic residues.

| Cleaning Methods | Equipment Type | Residues removed? |
|---|---|---|
| SPM + DHF | wet bench - batch process | No |
| DHF + SPM + SC1 | wet bench - batch process | Yes |
| SPM + DHF + SC1 + SC2 | wet bench - batch process | Yes |
| SPM + DHF (spin) | wet bench - batch process (SPM) spin tool - single wafer process (DHF) | Yes |
| DHF + SC2 | wet bench - batch process | Yes |

Examples of oxide thickness grown by the cleaning process above are shown in Table 3. For example, the SC1 process oxide growth can be approximately 5.85 angstroms or approximately 5.96 angstroms. For the SC2 process, examples of the oxide growth can be approximately one and fifty-four hundredths angstroms or approximately one and fifty-five hundredths angstroms. For the SPM+SC1 process, examples of the oxide growth can be approximately seven and twenty-one hundredths angstroms or approximately seven and thirty-eight angstroms.

TABLE 3

Comparison of oxide thickness grown by SC1, SC2, and SPM + SC1 on bare Si.

|  | SC1 | SC2 | SPM + SC1 |
|---|---|---|---|
| Oxide growth (A) | 5.96 | 1.55 | 7.21 |
| Oxide growth (A) | 5.85 | 1.54 | 7.38 |

Figure 7:
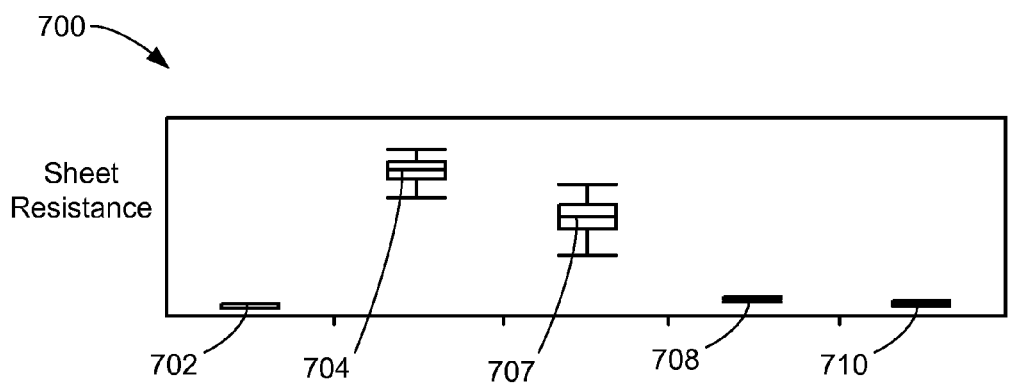
FIG. 7 is a chart of polysilicon sheet resistance of the integrated circuit system of FIG. 1.

Referring now to FIG. 7, therein is shown a chart of polysilicon sheet resistance 700 of the integrated circuit system 100 of FIG. 1. The chart 700 shows sheet resistance (Rs) for polysilicon regions using various cleaning processes.

A first Rs 702 results from the SPM process and the DHF applied over the integrated circuit wafer 102 of FIG. 1. The SPM+DHF process provides improved electrical properties with degraded yield.

A second Rs 704 results from the DHF process, the SPM process, and the SC1 process applied over the integrated circuit wafer 102. The DHF+SPM+SC1 process provides significantly degraded electrical properties.

A third Rs 706 results from the SPM process, the DHF process, the SC1 process, and the SC2 process applied over the integrated circuit wafer 102. The SPM+DHF+SC1+SC2 process provides degraded electrical properties.

A fourth Rs 708 results from the SPM process, the DHF process with a single wafer spin processor (not shown) over the integrated circuit wafer 102. The SPM+DHF process with single wafer spin processor provides improved electrical properties at a high cost in both throughput and equipment.

A fifth Rs 710 results from the DHF process and the SC2 process applied over the integrated circuit wafer 102. The DHF+SC2 process provides improved electrical properties with known technology and materials.

Figure 8:
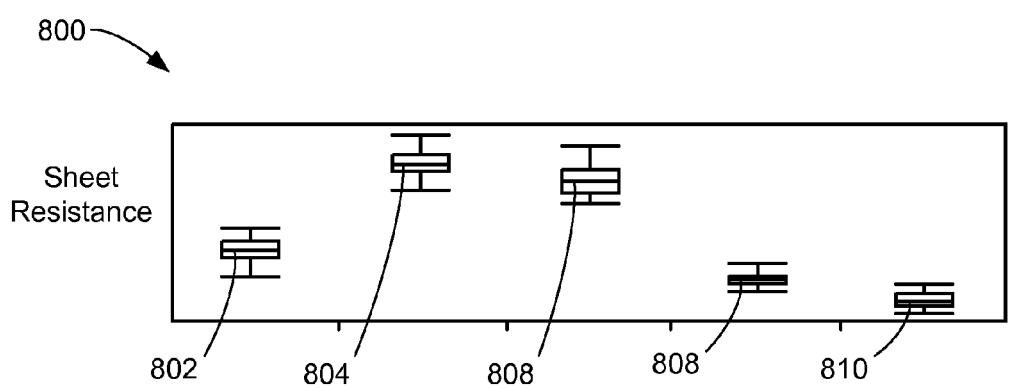
FIG. 8 is a chart of contact sheet resistance for the integrated circuit system of FIG. 1.

Referring now to FIG. 8, therein is shown a chart of contact sheet resistance 800 for the integrated circuit system 100 of FIG. 1. The chart 800 shows sheet resistance (Rs) for an active contact chain using various cleaning processes.

A first Rs 802 results from the SPM process and the DHF applied over the integrated circuit wafer 102 of FIG. 1. The SPM+DHF process provides partially degraded electrical properties with degraded yield.

A second Rs 804 results from the DHF process, the SPM process, and the SC1 process applied over the integrated circuit wafer 102. The DHF+SPM+SC1 process provides significantly degraded electrical properties.

A third Rs 806 results from the SPM process, the DHF process, the SC1 process, and the SC2 process applied over the integrated circuit wafer 102. The SPM+DHF+SC1+SC2 process provides significantly degraded electrical properties.

A fourth Rs 808 results from the SPM process, the DHF process with a single wafer spin processor (not shown) over the integrated circuit wafer 102. The SPM+DHF process with single wafer spin processor provides partially degraded electrical properties at a high cost in both throughput and equipment.

A fifth Rs 810 results from the DHF process and the SC2 process applied over the integrated circuit wafer 102. The DHF+SC2 process provides improved electrical properties with known technology and materials.

Figure 9:
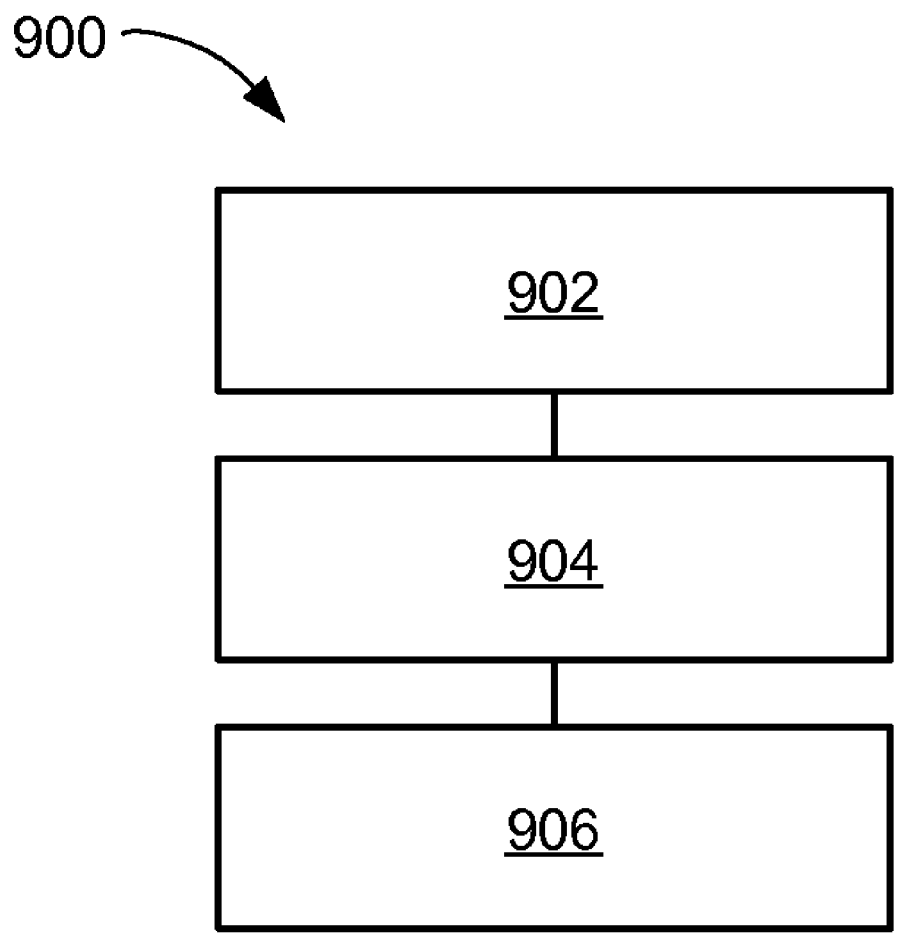
FIG. 9 is a flow chart of an integrated circuit system for manufacturing the integrated circuit system in an embodiment of the present invention.

Referring now to FIG. 9, therein is shown a flow chart of an integrated circuit system 900 for manufacturing the integrated circuit system 100 in an embodiment of the present invention. The system 900 includes providing an integrated circuit wafer in a block 902; applying a first cleaning solution over the integrated circuit wafer in a block 904; and applying a second cleaning solution over the integrated circuit wafer to prevent or remove a defect resulting from the first cleaning process in a block 906.

In greater detail, a system to provide the method and apparatus of the integrated circuit system 100, in an embodiment of the present invention, is performed as follows:

1. Providing an integrated circuit wafer having a wafer active surface.
2. Applying a first cleaning solution over the wafer active surface.
3. Applying a second cleaning solution over the wafer active surface to prevent or remove a residue or a particle resulting from the first cleaning solution.
4. Processing a wafer process layer over the wafer active surface having the residue or the particle substantially eliminated.

Thus, it has been discovered that the method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacturing an integrated circuit system comprising:
   providing an integrated circuit wafer;
   applying a first cleaning solution as a liquid over the integrated circuit wafer; and
   applying a second cleaning solution over the integrated circuit wafer to prevent or remove a defect resulting from the first cleaning process.

2. The method as claimed in claim 1 wherein applying the second cleaning solution includes applying a solution having hydrochloric peroxide.

3. The method as claimed in claim 1 wherein applying the second cleaning solution includes applying a de-ionized water rinse.

4. The method as claimed in claim 1 wherein applying the first cleaning solution includes applying a solution having diluted acid.

5. The method as claimed in claim 1 wherein applying the first cleaning solution includes applying a solution having buffered acid.

6. The method as claimed in claim 1 further comprising applying a wafer process layer over the integrated circuit wafer.

7. A method of manufacturing an integrated circuit system comprising:
   providing an integrated circuit wafer;
   applying a first cleaning solution as a liquid over the integrated circuit wafer;
   applying a second cleaning solution over the integrated circuit wafer to prevent or remove a defect resulting from the first cleaning solution; and
   applying a wafer process layer over the integrated circuit wafer having the defect substantially eliminated.

8. The method as claimed in claim 7 wherein applying the second cleaning solution includes:
   applying a first de-ionized water rinse over the integrated circuit wafer;
   applying a hydrochloric peroxide solution over the integrated circuit wafer;
   applying a second de-ionized water rinse over the integrated circuit wafer; and
   drying the integrated circuit wafer.

9. The method as claimed in claim 7 wherein applying the first cleaning solution includes wet etching an oxide over the integrated circuit wafer.

10. The method as claimed in claim 7 wherein applying the first cleaning solution includes applying a diluted hydrofluoric acid solution.

11. The method as claimed in claim 7 wherein applying the first cleaning solution includes applying a buffered hydrofluoric acid solution.

12. The method as claimed in claim 7 wherein processing the wafer process layer includes applying a silicidation layer over the integrated circuit wafer.

13. A method of manufacturing an integrated circuit system comprising:
   providing an integrated circuit wafer having a wafer active surface;
   applying a first cleaning solution as a liquid over the wafer active surface;
   applying a second cleaning solution over the wafer active surface to prevent or remove a residue or a particle resulting from the first cleaning solution; and
   processing a wafer process layer over the wafer active surface having the residue or the particle substantially eliminated.

14. The method as claimed in claim 13 wherein applying the second cleaning solution includes applying a Standard Clean-2 solution having HCL, $H_2O_2$, $H_2O$, or combinations thereof.

15. The method as claimed in claim 13 wherein applying the second cleaning solution includes applying a second cleaning solution having HCL, $H_2O_2$, and $H_2O$ in a ratio range of 1:1:1 to 1:1:1000.

16. The method as claimed in claim 13 wherein applying the first cleaning solution includes forming the residue or the particle from carbon-based contaminants.

17. The method as claimed in claim 13 wherein applying the first cleaning solution includes forming the residue or the particle from an arsenic implant.

18. The method as claimed in claim 13 wherein applying the first cleaning solution includes applying a DHF solution having diluted HF acid resulting in the wafer active surface hydrogen-terminated.

19. The method as claimed in claim 13 wherein applying the first cleaning solution includes applying a BHF solution having buffered HF acid resulting in the wafer active surface hydrogen-terminated.

20. The method as claimed in claim 13 wherein processing the wafer process layer includes applying Co or Ni silicidation over the wafer active surface.

* * * * *